United States Patent
Ng et al.

(10) Patent No.: US 8,427,248 B2
(45) Date of Patent: Apr. 23, 2013

(54) STABILIZATION NETWORK AND A SEMICONDUCTOR DEVICE HAVING THE STABILIZATION NETWORK

(75) Inventors: Choon Yong Ng, Kawasaki (JP);
Kazutaka Takagi, Kawasaki (JP);
Naotaka Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 12/417,089

(22) Filed: Apr. 2, 2009

(65) Prior Publication Data

US 2010/0073099 A1 Mar. 25, 2010

(30) Foreign Application Priority Data

Sep. 25, 2008 (JP) ................................ 2008-246652

(51) Int. Cl.
*H03B 9/12* (2006.01)
*H03B 7/06* (2006.01)

(52) U.S. Cl.
USPC ................. 331/107 G; 331/115; 331/117 FE; 331/132

(58) Field of Classification Search ............... 331/107 G, 331/115, 117 FE, 117 R, 132, 167
See application file for complete search history.

(56) References Cited

U.S. PATENT DOCUMENTS

| | | | | |
|---|---|---|---|---|
| 2,878,386 A * | 3/1959 | Chow et al. | ................ | 331/117 R |
| 3,435,374 A * | 3/1969 | Whitten | ..................... | 331/107 R |
| 3,986,152 A * | 10/1976 | Howell | .......................... | 333/216 |
| 4,463,307 A * | 7/1984 | Kiko et al. | ..................... | 323/356 |
| 5,157,357 A * | 10/1992 | Katoh | .............................. | 331/74 |
| 5,343,172 A * | 8/1994 | Utsu et al. | ....................... | 333/32 |
| 5,920,235 A * | 7/1999 | Beards et al. | ............. | 331/108 D |
| 6,154,102 A * | 11/2000 | Weber | ....................... | 331/117 R |
| 6,587,005 B2 * | 7/2003 | Ichihara | .......................... | 331/16 |
| 6,731,182 B2 * | 5/2004 | Sakurai | ..................... | 331/177 V |
| 6,765,448 B2 * | 7/2004 | Wu et al. | ................. | 331/117 FE |
| 7,622,776 B2 * | 11/2009 | Kawasaki | ..................... | 257/361 |
| 7,741,670 B2 * | 6/2010 | Pan | ................. | 257/306 |
| 2005/0054295 A1* | 3/2005 | Moloudi | ...................... | 455/63.1 |
| 2007/0146104 A1* | 6/2007 | Lee | .................................... | 335/4 |
| 2008/0007357 A1 | 1/2008 | Tserng et al. | | |

FOREIGN PATENT DOCUMENTS

| | | |
|---|---|---|
| JP | 47-22607 | 10/1972 |
| JP | 60-82824 | 6/1985 |
| JP | 61-189710 | 8/1986 |
| JP | 5-48641 | 7/1993 |
| JP | 6-77749 | 3/1994 |

(Continued)

OTHER PUBLICATIONS

U.S. Appl. No. 12/780,280, filed May 14, 2010, Ng, et al.

(Continued)

*Primary Examiner* — Levi Gannon
(74) *Attorney, Agent, or Firm* — Oblon, Spivak, McClelland, Maier & Neustadt, L.L.P.

(57) ABSTRACT

A stabilization network and a semiconductor device having the stabilization network wherein the stabilization network includes an active element having a negative resistance accompanying a high frequency negative resistance oscillation; and a tank circuit composed of a resistance connected to a main electrode of the active element, an inductance and capacitance which are connected in parallel with the resistance and synchronize with an oscillating frequency of the high frequency negative resistance oscillation, wherein the stabilization network is performed for suppressing a negative resistance accompanying a Gunn oscillation and obtaining stable and highly efficient power amplification.

16 Claims, 9 Drawing Sheets

FOREIGN PATENT DOCUMENTS

| | | |
|---|---|---|
| JP | 6-188643 | 7/1994 |
| JP | 6-188654 | 7/1994 |
| JP | 6-268458 | 9/1994 |
| JP | 8-130419 | 5/1996 |
| JP | 8-330841 | 12/1996 |
| JP | 09-064655 | 3/1997 |
| JP | 2791840 B2 | 8/1998 |
| JP | 3064939 B2 | 7/2000 |
| JP | 2001-230860 | 8/2001 |
| JP | 2007-158660 | 6/2007 |
| JP | 2008-5422 | 1/2008 |

OTHER PUBLICATIONS

Office Action issued May 17, 2011, in Japanese Patent Application No. 2008-246652 (with English-language translation).

U.S. Appl. No. 13/352,810, filed Jan. 18, 2012, Takagi.

Office Action issued Mar. 13, 2012 in Japan Application No. 2008-246652 (With English Translation).

Office Action issued Sep. 11, 2012, in Japanese Patent Application No. 2008-246652 (with English-language Translation).

* cited by examiner

STABILIZATION NETWORK AND A SEMICONDUCTOR DEVICE HAVING THE STABILIZATION NETWORK

CROSS REFERENCE TO RELATED APPLICATIONS AND INCORPORATION BY REFERENCE

This application is based upon and claims the benefit of priority from prior Japanese Patent Applications No. P2008-246652 filed on Sep. 25, 2008, the entire contents of which are incorporated herein by reference.

TECHNICAL FIELD

The present invention relates to a stabilization network and a semiconductor device having the stabilization network, and in particular, relates to a stabilization network for suppressing a negative resistance accompanying a Gunn oscillation and obtaining stable and highly efficient power amplification, and a semiconductor device having the stabilization network.

BACKGROUND ART

A transistor and an amplifier which apply III-V compound semiconductors, such as GaAsMESFETs (Gallium Arsenide Metal Semiconductor Field Effect Transistors), GaAspHEMTs (Gallium Arsenide p channel High Electron Mobility Transistors), and InPHEMTs (Indium Phosphide High Electron Mobility Transistors), may be affected by the influence of a high frequency oscillation based on a negative resistance which appears in a drain side output known as a Gunn oscillation. Although such a Gunn oscillation is applicable as a source of an oscillation of microwave and millimeter wave, it is not a preferable phenomenon for stable and highly efficient operation of a power amplifier.

Figure 1:
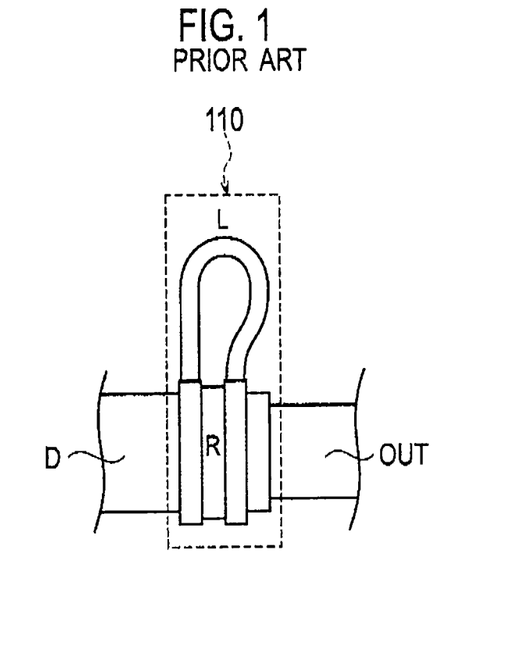
FIG. 1 is a schematic plane pattern configuration diagram of a stabilization network of a conventional example.

A schematic plane pattern configuration of a stabilization network according to a conventional example for suppressing such a Gunn oscillation is expressed as shown in FIG. 1. Moreover, a circuit configuration corresponding to FIG. 1 is expressed as shown in FIG. 2 (for example, refer to Patent Literature 1).

Figure 2:
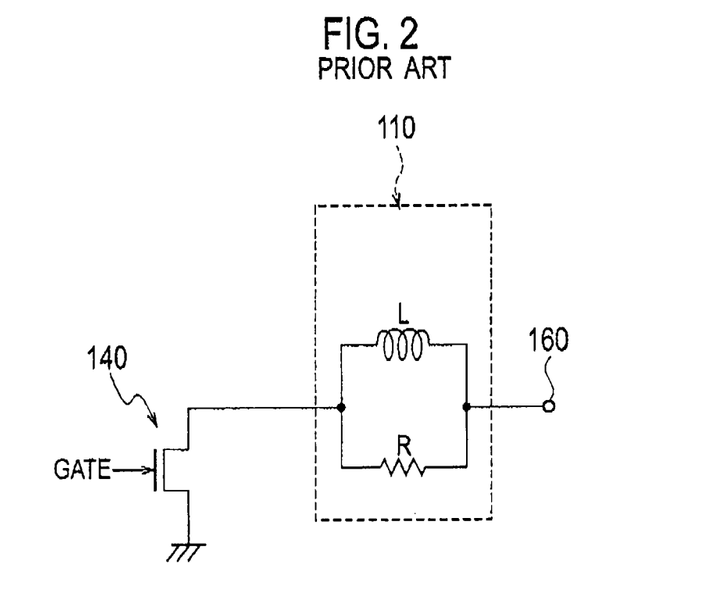
FIG. 2 is a circuit configuration chart corresponding to FIG. 1.

In the Patent Literature 1, as shown in FIG. 1 to FIG. 2, it connects between a drain of FET 140 and an output terminal 160 by applying into the stabilization network 110 the parallel circuit composed of a resistance R and an inductance L.

However, it is not an effective method to use the parallel circuit composed of the resistance R and the inductance L as the stabilization network 110, on it removes the negative resistance which appears in the drain side output of FET 140 and inhibits the influence of the Gunn oscillation based on the negative resistance.

It is because the inductance L does not become a short circuit for a high frequency signal but operates as RF chokes rather.

The value of the inductance L should reserve the rather very small value for high frequency oscillating frequency such as a Gunn oscillation. Even if it connects between the drain of FET 140 and the output terminal 160 by applying into a stabilization network RL the parallel circuit disclosed in the Patent Literature 1, it is difficult to obtain a preferable positive value of resistance in order to fully cancel the negative resistance accompanying the Gunn oscillation.

CITATION LIST

Patent Literature 1: United States Patent Application Publication No. 2008/0007357

SUMMARY OF THE INVENTION

Technical Problem

The purpose of the invention is to provide a stabilization network for suppressing the negative resistance accompanying the Gunn oscillation and obtaining stable and highly efficient power amplification and a semiconductor device having the stabilization network.

Solution to Problem

According to an aspect of the invention, a stabilization network includes: a resistance connected to a main electrode of an active element having a negative resistance accompanying a high frequency negative resistance oscillation; and a tank circuit which is composed of an inductance and capacitance which are connected in parallel with the resistance and synchronize with an oscillating frequency of the high frequency negative resistance oscillation, wherein the negative resistance of the active element is canceled.

According to another aspect of the invention, a semiconductor device having a stabilization network includes: wherein the stabilization network includes: an active element having a negative resistance accompanying a high frequency negative resistance oscillation; and a tank circuit composed of a resistance connected to a main electrode of the active element, an inductance and capacitance which are connected in parallel with the resistance and synchronize with an oscillating frequency of the high frequency negative resistance oscillation, wherein the stabilization network cancels the negative resistance.

Advantageous Effects of Invention

According to the present invention, the stabilization network for suppressing the negative resistance accompanying the Gunn oscillation and obtaining stable and highly efficient power amplification and the semiconductor device having the stabilization network can be provided.

DESCRIPTION OF EMBODIMENTS

There will be described embodiments of the present invention, with reference to the drawings, where like members or elements are designated by like reference characters to eliminate redundancy, and some layers, their subsidiary regions and circuits components are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment (Stabilization Network)

Figure 3:
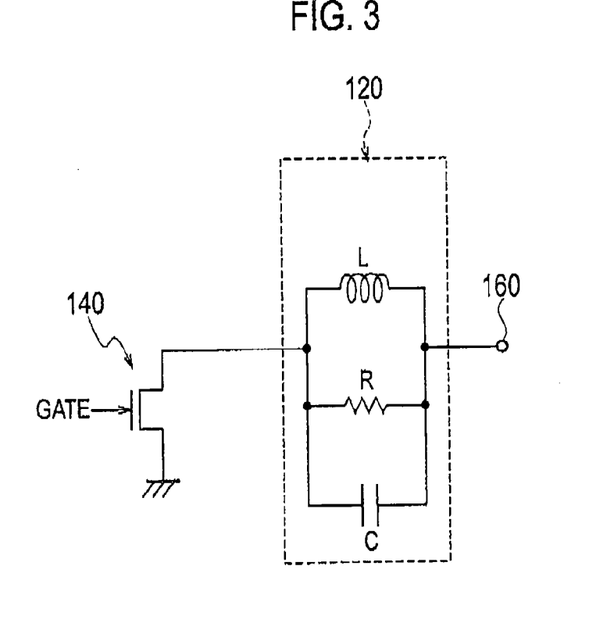
FIG. 3 is a circuit configuration chart of a stabilization network and a semiconductor device having a stabilization network according to a first embodiment of the present invention.

As shown in FIG. 3, a stabilization network 120 according to a first embodiment includes: a resistance R connected to a main electrode of the active element 140 which has a negative resistance accompanying a high frequency negative resistance oscillation; and a tank circuit composed of an inductance L and a capacitance C which are connected in parallel with the resistance R and synchronize with a oscillating frequency $F_{osc}$ of the high frequency negative resistance oscillation. The stabilization network 120 according to the first embodiment cancels the negative resistance of the active element 140.

In this case, the high frequency negative resistance oscillation is a Gunn oscillation, for example.

Since the ability to provide an infinite reactance by LC parallel circuit which resonates with the oscillating frequency $F_{osc}$ of the Gunn oscillation, it becomes possible to give a positive value of resistance to the main electrode of the active element 140.

According to this, the stabilization network 120 according to the first embodiment can remove the negative resistance in the oscillating frequency $F_{osc}$ of the Gunn oscillation, and can suppress the Gunn oscillation.

The flexibility for obtaining the desired value of the inductance L increases by adding the capacitance C in parallel for RL parallel circuit.

Thus, an RLC parallel circuit can be connected between the main electrode of the active element 140 and the output terminal 160, and a high frequency Gunn oscillation can be suppressed.

While the negative resistance accompanying the Gunn oscillation can be canceled and a positive value of resistance can be given to the main electrode of the active element 140 by setting up an LC tank circuit synchronize with the Gunn oscillation frequency $F_{osc}$, the capacitance C becomes short for desired signal frequency.

In this case, the active element 140 may be composed of an FET, a HEMT, a Gunn diode, an IMPATT diode, or a TUNNETT diode.

More specifically, the active element 140 may be composed of GaAsMESFETs, GaAsHEMTs, InPHEMTs, etc.

For example, in FETs, an oscillation phenomenon such as a Gunn oscillation is occurred according to the negative resistance effect of appearing in the drain.

One measure for canceling this negative resistance effect is adding positive resistance for this negative resistance. Therefore, the RLC parallel circuit is connected to the drain of FETs. In an RLC parallel circuit, the LC parallel circuit set up to synchronize with the oscillating frequency $F_{osc}$ of the Gunn oscillation generates infinite impedance, and becomes open for RF high frequency, and the positive resistance R appears as a result.

(Plane Pattern Configuration)

Figure 4:
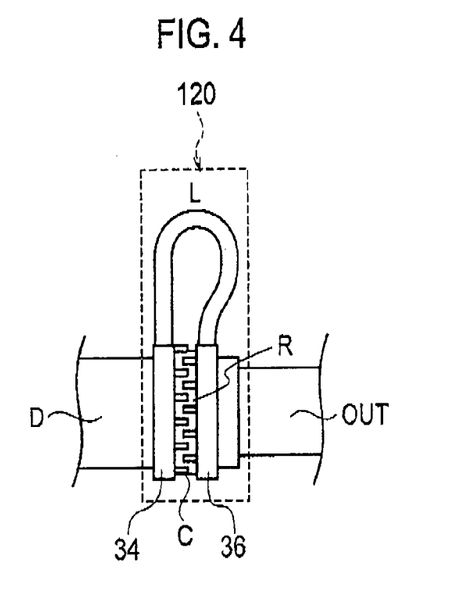
FIG. 4 is a schematic plane pattern configuration diagram of the stabilization network according to the first embodiment of the present invention.

As shown in FIG. 4, a schematic plane pattern configuration of the stabilization network 120 according to the first embodiment includes: a resistance R formed by the thin film resistor etc.; an inductance L connected in parallel with the resistance R; and a capacitance C which is connected in parallel with these RL circuits, and is formed in the upper part of the resistance R, in between the drain terminal electrodes D of the FET 140 and the outputs OUT which are shown in FIG. 3.

As shown in FIG. 4, the capacitance C may be placed adjacent to the inductance L.

Moreover, as shown in FIG. 4, the capacitance C may be placed being laminated by the upper part of the resistance R.

Or the capacitance C may be placed being laminated by the lower part of the resistance R.

Or the capacitance C may have an inter-digital capacitance structure composed of a first metallic pattern 34 and a second metallic pattern 36 placed adjacent to the first metallic pattern 34, as shown in FIG. 4.

The inductance L may be formed with electrode wiring.

(Semiconductor Device)

As shown in FIG. 3, a circuit configuration of a semiconductor device having the stabilization network according to the first embodiment includes: an active element 140 having a negative resistance accompanying a high frequency negative resistance oscillation; a resistance R connected to the main electrode of the active element 140; and a stabilization network 120 composed of a tank circuit composed of an inductance L and the capacitance C which are connected in parallel with the resistance R and synchronize with the oscillating frequency $F_{osc}$ of the high frequency negative resistance oscillation. The stabilization network 120 cancels the negative resistance as above-mentioned.

(Configuration of FET)

Figure 5:
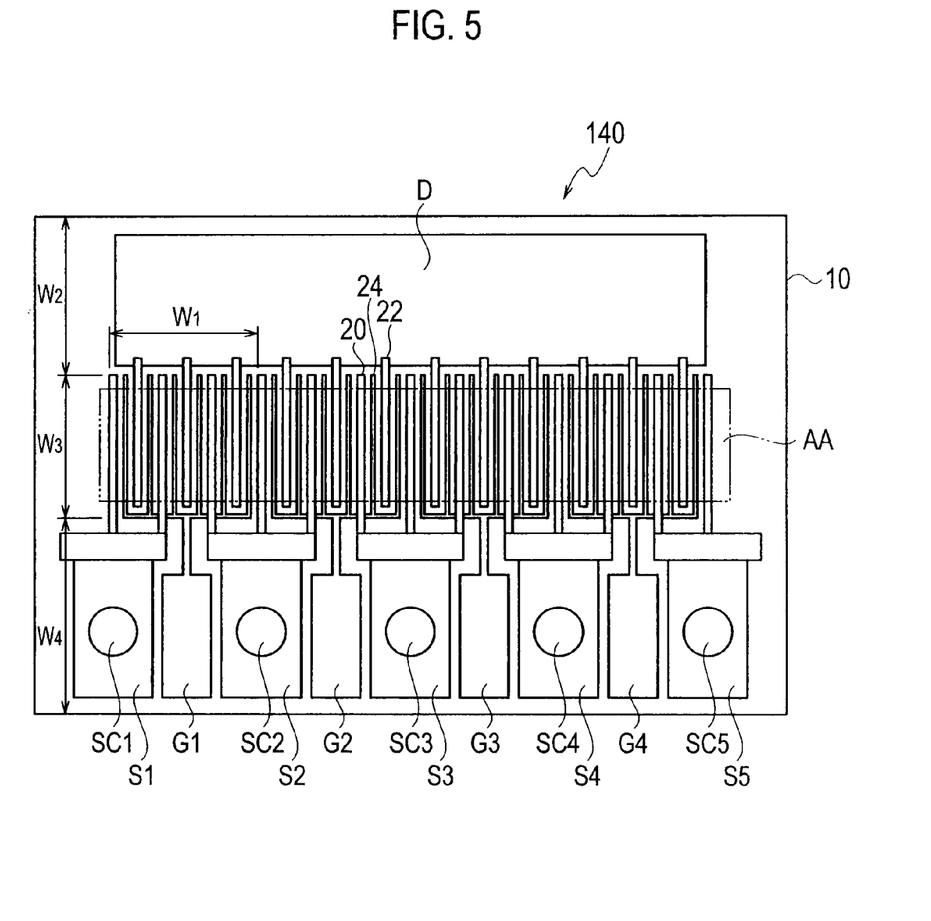
FIG. 5 is a schematic plane pattern configuration diagram of an FET which is to have the stabilization network according to the first embodiment of the present invention.

As shown in FIG. 5, a schematic plane pattern configuration of FET 140 which is to have the stabilization network according to the first embodiment includes: a substrate 10; a gate electrode 24, a source electrode 20, and a drain electrode 22 which are placed on the substrate 10 and have a plurality of fingers, respectively; gate terminal electrodes G1, G2, . . . , G4, source terminal electrodes S1, S2, . . . , S5, and a drain terminal electrode D which are placed on the substrate 10, govern a plurality of fingers, respectively and are formed for every the gate electrode 24, the source electrode 20, and the drain electrode 22; and VIA holes SC1, SC2, . . . , SC5 connected to the source terminal electrodes S1, S2, . . . , S5.

On the substrate 10, the gate electrode 24, the source electrode 20, and the drain electrode 22 have a plurality of fingers, govern a plurality of fingers for every the gate electrode 24, the source electrode 20, and the drain electrode 22, and form the electrode for terminals. A part into which the gate electrode 24, the source electrode 20, and the drain electrode 22 have a plurality of finger shape forms an active area AA, as shown in FIG. 5.

In the example of FIG. 5, the gate terminal electrodes G1, G2, . . . , G4 and the source terminal electrodes S1, S2, . . . , S5 are placed a terminal of one side, and the drain terminal electrode D is placed a terminal of another side.

In the near the surface of the substrate 10, the active area AA is formed on the substrate 10 of the lower part of the gate electrode 24, the source electrode 20, and the drain electrode 22.

In the example of FIG. 5, in the source terminal electrodes S1, S2, . . . , S5 near the active area AA, the VIA holes SC1, SC2, . . . , SC5 are formed from the back side of the substrate 10, and the ground conductor is formed on the back side of the substrate 10. And when grounding a circuit element, the circuit element provided on the substrate 10, and the ground conductor formed in the back side of the substrate 10 are electrically connected via the VIA holes SC1, SC2, . . . , SC5 which pass through the substrate 10.

In addition, the gate terminal electrodes G1, G2, . . . , G4 are connected to a surrounding semiconductor chip by a bonding wire etc., and the drain terminal electrode D is also connected to a surrounding semiconductor chip by a bonding wire etc.

Moreover, the substrate 10 may be provided with either of a SiC substrate, a GaAs substrate, a GaN substrate, a substrates in which the GaN epitaxial layer is formed on the SiC substrate, a substrate in which the GaN epitaxial layer is formed on a Si substrate, a substrate in which the heterojunction epitaxial layer composed of GaN/AlGaN is formed on the SiC substrate, a substrate in which the GaN epitaxial layer is formed on the sapphire substrate, a sapphire substrate or a diamond substrate, and a semi-insulating substrate.

According to the first embodiment, the stabilization network for suppressing the negative resistance accompanying the Gunn oscillation and obtaining stable and highly efficient power amplification and the semiconductor device having the stabilization network can be provided.

Second Embodiment

Figure 6:
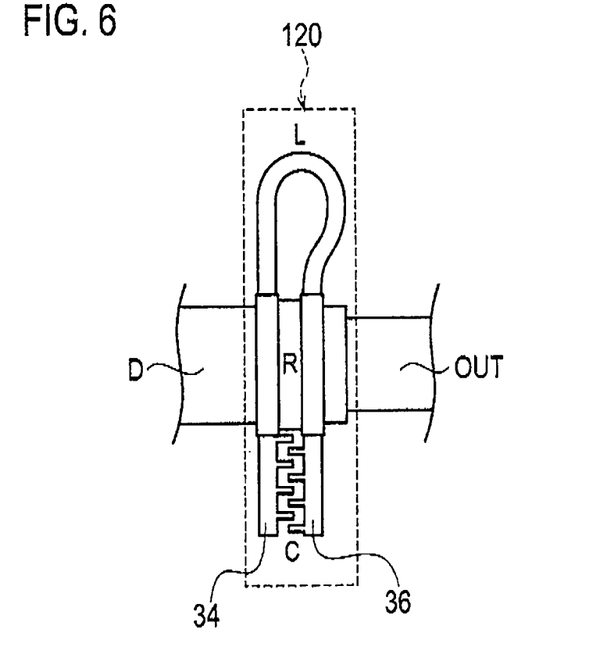
FIG. 6 is a schematic plane pattern configuration diagram of a stabilization network according to a second embodiment of the present invention.

As shown in FIG. 6, a schematic plane pattern configuration of a stabilization network 120 according to a second embodiment includes: a resistance R formed by the thin film resistor etc.; an inductance L connected in parallel with the resistance R; and a capacitance C which is connected in parallel with these RL circuits, and is placed adjacent to the resistance R, in between a drain terminal electrodes D of FET 140 and an outputs OUT which are shown in FIG. 3.

As shown in FIG. 6, the capacitance C has an inter-digital capacitance structure composed of a first metallic pattern 34 and a second metallic pattern 36 which is placed adjacent to the first metallic pattern 34.

The inductance L may be formed with electrode wiring.

Figure 7:
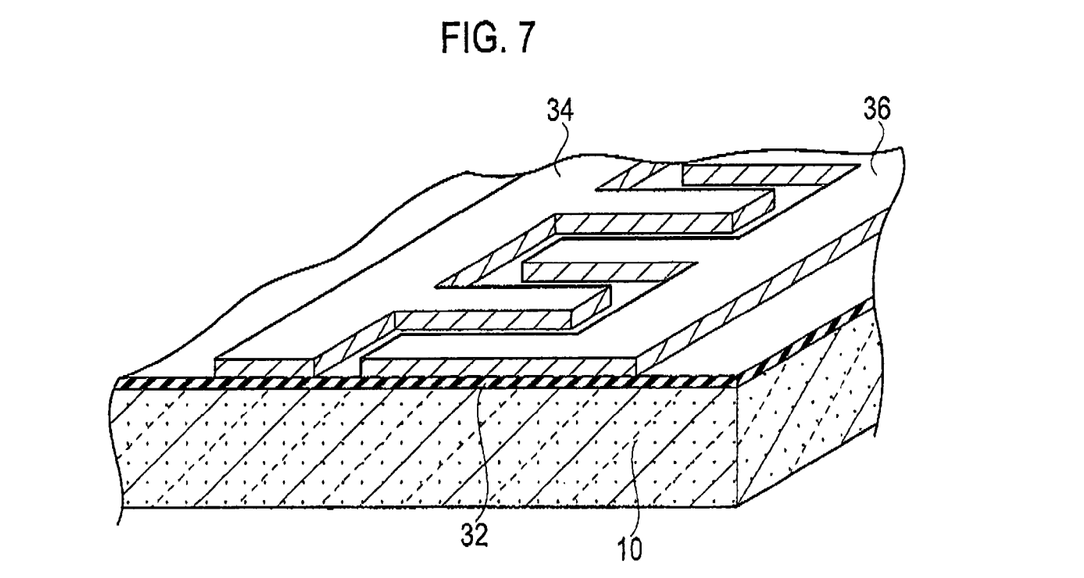
FIG. 7 is a schematic bird's-eye view showing a configuration of an inter-digital capacitance of the stabilization network according to the second embodiment of the present invention.

As shown in FIG. 7, the inter-digital capacitance structure of the stabilization network 120 according to the second embodiment, for example, is composed of a substrate 10, an insulating layer 32 placed on the substrate, the first metallic pattern 34 placed on the insulating layer 32, and the second metallic pattern 36 which is placed on the insulating layer 32 adjacent to the first metallic pattern 34. The first metallic pattern 34 and the second metallic pattern 36 are formed with aluminum (Al), for example, and the insulating layer 32 is formed with a silicon nitride film, a silicon dioxide film, a silicon oxynitride film, etc., for example. In addition, between the first metallic pattern 34 and the second metallic pattern 36, it may be an aperture or may fill up with insulating layers, such as SiO2.

Moreover, the substrate 10 may be provided with either of a SiC substrate, a GaAs substrate, a GaN substrate, a substrates in which the GaN epitaxial layer is formed on the SiC substrate, a substrate in which the GaN epitaxial layer is formed on a Si substrate, a substrate in which the heterojunction epitaxial layer composed of GaN/AlGaN is formed on the SiC substrate, a substrate in which the GaN epitaxial layer is formed on the sapphire substrate, a sapphire substrate or a diamond substrate, and a semi-insulating substrate.

Since the circuit configuration of the semiconductor device having the stabilization network 120 according to the second embodiment is the same as that of FIG. 3, the description is omitted.

Moreover, since the schematic plane pattern configuration of FET having the stabilization network according to the second embodiment is the same as that of FIG. 5, the description is omitted.

According to the second embodiment, the stabilization network for suppressing the negative resistance accompanying the Gunn oscillation and obtaining stable and highly efficient power amplification and the semiconductor device having the stabilization network can be provided.

Third Embodiment (Semiconductor Device)

Figure 8:
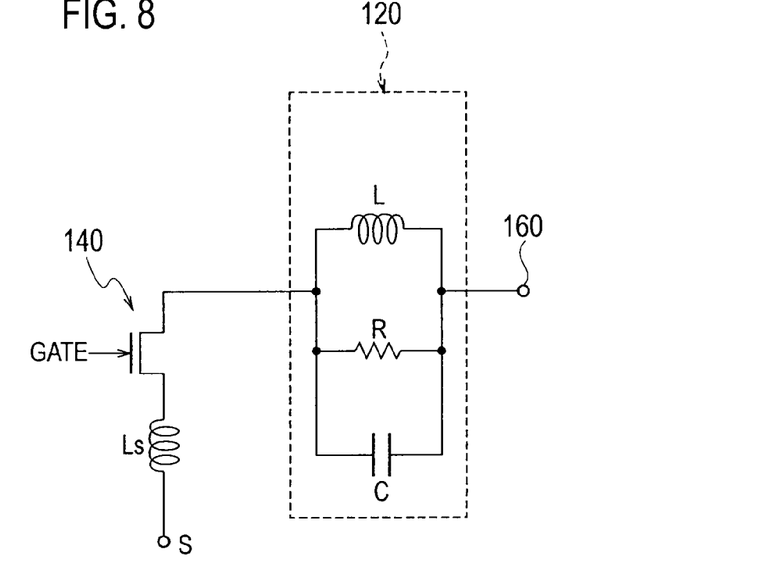
FIG. 8 is a circuit configuration chart of a stabilization network and a semiconductor device having the stabilization network according to a third embodiment of the present invention.

In a third embodiment, as shown in FIG. 8, a source inductance Ls connected to the main electrode of another side of the active element 140 is provided.

As shown in FIG. 8, a circuit configuration of a semiconductor device having a stabilization network according to the third embodiment includes: an active element 140 having a negative resistance accompanying a high frequency negative resistance oscillation; a resistance R connected to one side of the main electrode of the active element 140; a stabilization network 120 which is connected in parallel with the resistance R and is composed of the inductance L which synchronizes with the oscillating frequency $F_{osc}$ of the high frequency negative resistance oscillation, and a tank circuit composed of the capacitance C; and a source inductance Ls connected to the main electrode of another side of the active element 140. In the stabilization network 120, the point which cancels negative resistance is the same as that of the first embodiment.

In the third embodiment, the source inductance Ls is connected between the source of the active element 140, and grounding electric potential. In addition to the stabilization network 120, the high frequency oscillation of the Gunn oscillation etc. can be further suppressed by connecting the source inductance Ls between the source of the active element 140, and grounding electric potential. The value of Ls is about 0.1 nH to 0.5 nH, for example.

Also in the 3rd embodiment, the same plane pattern configuration as the stabilization network 120 according to the first embodiment shown in FIG. 4 or the stabilization network 120 according to the second embodiment shown in FIG. 6 is applicable.

Moreover, also in the third embodiment, since the schematic plane pattern configuration of FET 140 is the same as that of FIG. 5, the description is omitted.

According to the third embodiment, the stabilization network for suppressing the negative resistance accompanying the Gunn oscillation and obtaining stable and highly efficient power amplification and the semiconductor device having the stabilization network can be provided.

Fourth Embodiment (Stabilization Network)

The circuit configuration of a stabilization network 120 according to a fourth embodiment is the same as that of the first embodiment shown in FIG. 3. For this reason, the description of the stabilization network 120 is omitted.

(Plane Pattern Configuration)

Figure 9:
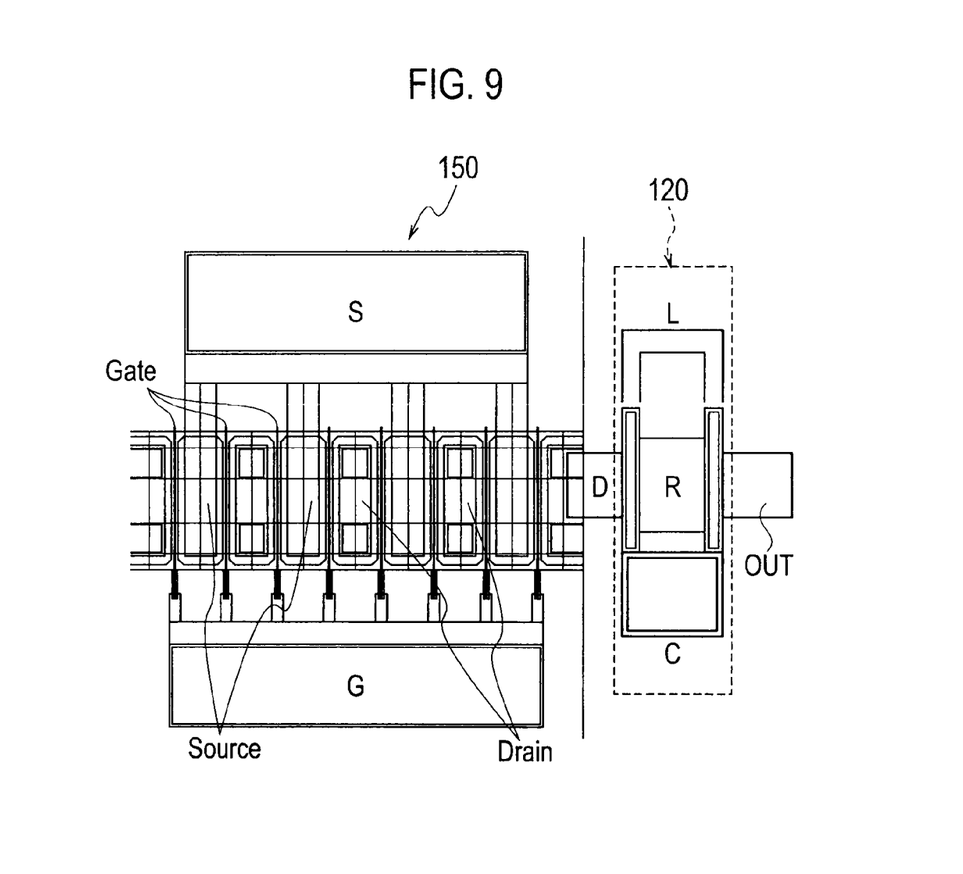
FIG. 9 is a schematic plane pattern configuration diagram of a stabilization network and a semiconductor device having the stabilization network according to a fourth embodiment of the present invention.

As shown FIG. 9, the schematic plane pattern configuration of the stabilization network 120 according to the fourth embodiment includes: a resistance R formed by the thin film resistor etc. between the drain terminal electrode D of FET 140 and the output OUT which are shown in FIG. 3; an inductance L connected in parallel with the resistance R; and a capacitance C which is connected in parallel with these RL circuits, and is placed adjacent to the resistance R.

Figure 10:
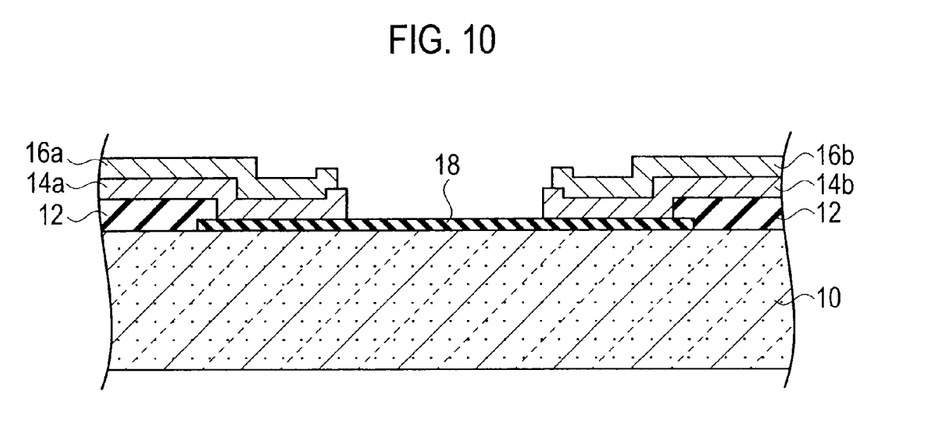
FIG. 10 is a schematic cross-sectional configuration chart showing a configuration of a resistance of the stabilization network according to the fourth embodiment of the present invention.

As shown in FIG. 10, the schematic section structure of the resistance R of the stabilization network 120 according to the fourth embodiment includes: a substrate 10; a resistance film 18 placed on the substrate 10; an insulating film 12 formed with the nitride film etc. which is placed on the substrate 10; metallic contacts layers 14a and 14b placed on the insulating film 12 and for taking electric contact with the resistance film 18, respectively; and metal layers 16a and 16b connected to the metallic contacts layers 14a and 14b, respectively. The insulating film 12 is formed with a silicon nitride film, a silicon dioxide film, a silicon oxynitride film, etc., for example. The metallic contacts layers 14a and 14b are formed with a polysilicon layer, for example, and the metal layers 16a and 16b are formed with Al, for example.

Figure 11:
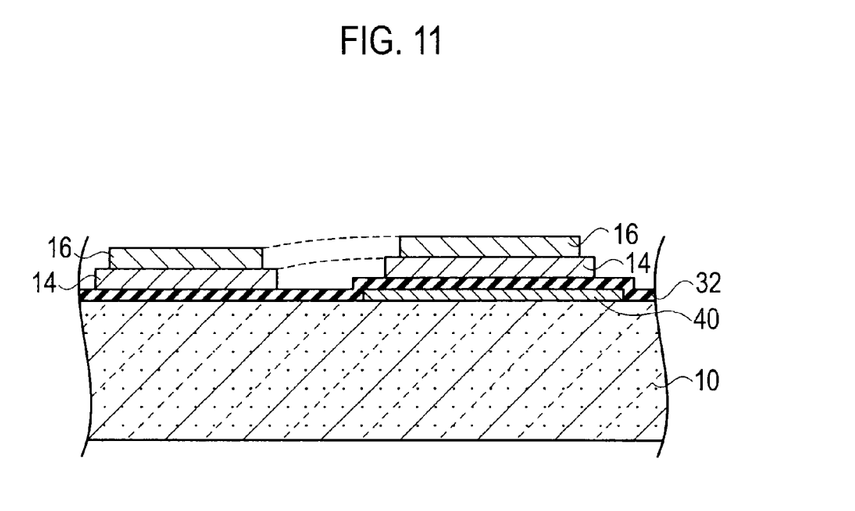
FIG. 11 is a schematic cross-sectional configuration chart showing a configuration of an MIM capacitance of the stabilization network according to the fourth embodiment of the present invention.

As shown in FIG. 11, the configuration of the MIM capacitance of the stabilization network 120 according to the fourth embodiment includes: a substrate 10; a third metallic pattern 40 placed on the substrate 10; an insulating layer 32 placed on the substrate 10 and the third metallic pattern 40; a metallic contacts layer 14 placed on the insulating layer 32; and a metal layer 16 placed on the metallic contacts layer 14. The MIM capacitance structure is formed from the third metallic pattern 40, the insulating layer 32, the metallic contacts layer 14, and the metal layer 16.

The inductance L may be formed with electrode wiring.

Moreover, the substrate 10 may be provided with either of a SiC substrate, a GaAs substrate, a GaN substrate, a substrates in which the GaN epitaxial layer is formed on the SiC substrate, a substrate in which the GaN epitaxial layer is formed on a Si substrate, a substrate in which the heterojunction epitaxial layer composed of GaN/AlGaN is formed on the SiC substrate, a substrate in which the GaN epitaxial layer is formed on the sapphire substrate, a sapphire substrate or a diamond substrate, and a semi-insulating substrate.

Since the circuit configuration of the semiconductor device having the stabilization network according to the fourth embodiment is similarly expressed as FIG. 3, the description is omitted.

(Configuration of FET)

As shown in FIG. 9, the schematic plane pattern configuration of FET 150 having the stabilization network according to the fourth embodiment includes: a gate electrode, a source electrode, and a drain electrode which are placed on the substrate and have a plurality of fingers, respectively; a gate terminal electrode G and a source terminal electrode S which are placed on the substrate, govern a plurality of fingers, respectively and are formed of every the gate electrode and the source electrode; and a drain terminal electrode D which is placed on the substrate and is formed of a plurality of fingers of the drain electrode with overlay electric contact, respectively.

According to the fourth embodiment, the stabilization network for suppressing the negative resistance accompanying the Gunn oscillation and obtaining stable and highly efficient power amplification and the semiconductor device having the stabilization network can be provided.

Fifth Embodiment (Stabilization Network)

The circuit configuration of a stabilization network 120 according to a fifth embodiment is the same as that of the first embodiment shown in FIG. 3. For this reason, the description of the stabilization network 120 is omitted.

(Plane Pattern Configuration)

Figure 12:
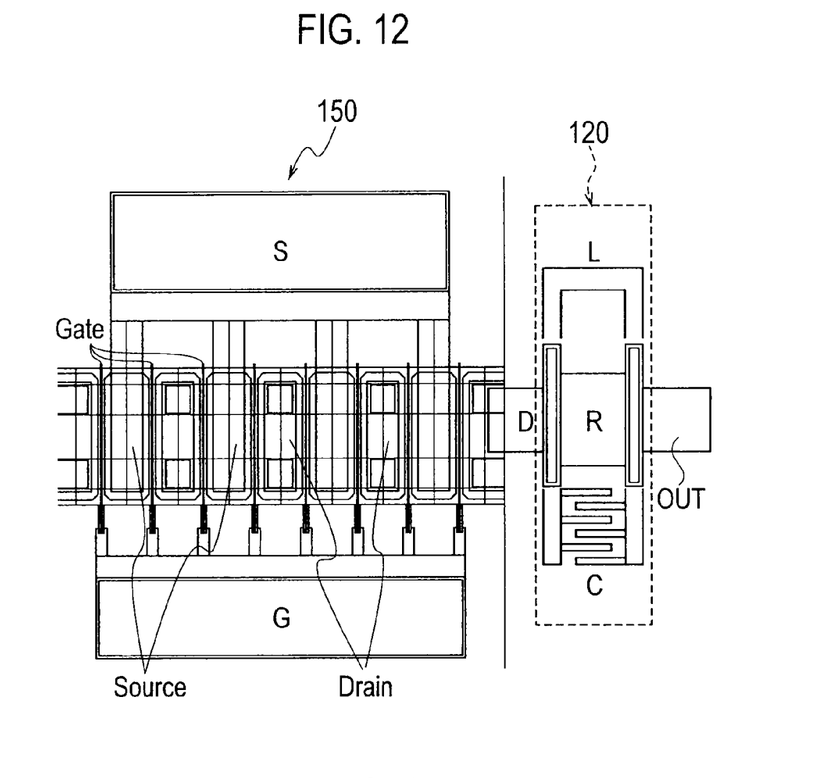
FIG. 12 is a schematic plane pattern configuration diagram of a stabilization network and a semiconductor device having the stabilization network according to a fifth embodiment of the present invention.

As shown in FIG. 12, the schematic plane pattern configuration of the stabilization network 120 according to the fifth embodiment includes: a resistance R formed with the thin film resistor etc. between the drain terminal electrode D of FET 140 and the output OUT which are shown in FIG. 3; an inductance L connected in parallel with the resistance R; and a capacitance C which is connected in parallel with these RL circuits, and is placed adjacent to the resistance R.

The capacitance C is provided with an inter-digital capacitance structure, as shown in FIG. 12.

The inductance L may be formed with electrode wiring.

The inter-digital capacitance structure of the stabilization network 120 according to the fifth embodiment can be formed as well as FIG. 7, for example.

Moreover, since the schematic plane pattern configuration of FET having the stabilization network according to the fifth embodiment is the same as that of FIG. 9, the description is omitted.

Moreover, since the circuit configuration of the semiconductor device having the stabilization network according to the fifth embodiment is similarly expressed as FIG. 3, the description is omitted.

According to the fifth embodiment, the stabilization network for suppressing the negative resistance accompanying the Gunn oscillation and obtaining stable and highly efficient power amplification and the semiconductor device having the stabilization network can be provided.

(Simulation Result)

—50Ω Terminating Resistance—

Figure 13:
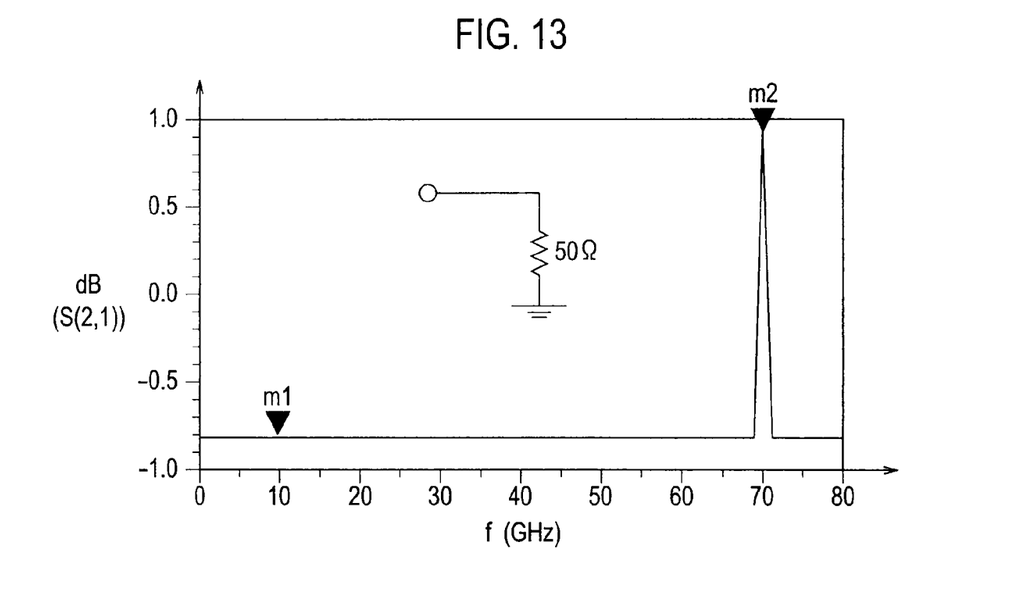
FIG. 13 shows an example of the simulation result at the time of connecting only 50Ω terminating resistance to an output terminal, in the semiconductor device having the stabilization network of the present invention.

In the semiconductor device having the stabilization network, an example of the simulation result at the time of connecting only 50Ω terminating resistance to the output terminal is shown in FIG. 13. A vertical axis expresses dB display of S parameter S(2, 1), and a horizontal axis expresses the frequency f (GHz). As clearly from FIG. 13, the peak of oscillating frequency is obtained in about 70 GHz. According to the simulation result, it is S(2, 1)=0.915 dB at 70 GHz, and is S(2, 1)=−0.828 dB at 10 GHz. In the drain of the FET, the high frequency oscillation based on the negative resistance appears, and the negative resistance value, which appears in the drain, is about −10Ω. At 70 GHz, it is S(2, 1)>0 dB, and the gain is shown.

—Resistance R—

Figure 14:
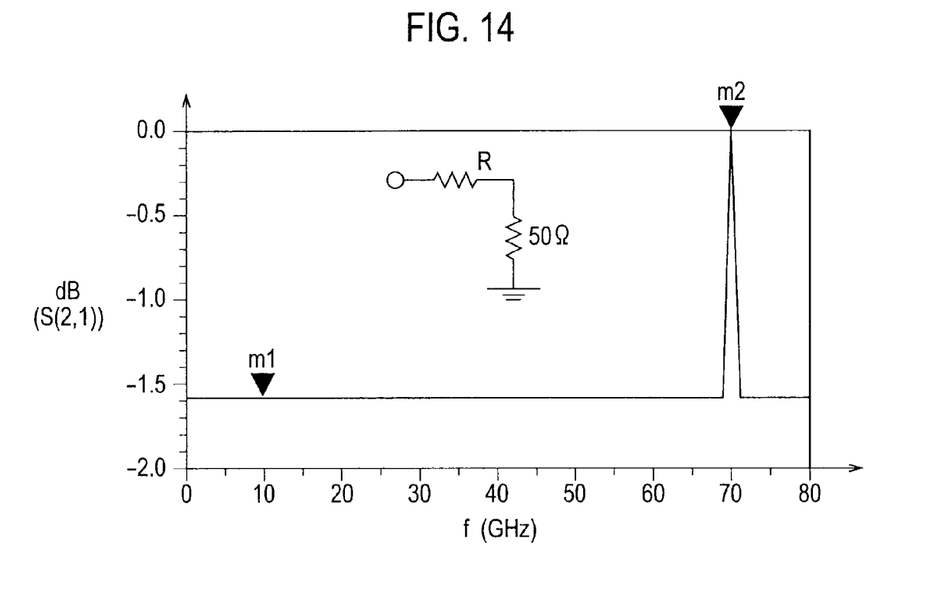
FIG. 14 shows an example of the simulation result at the time of connecting a resistance R and connecting 50Ω terminating resistance to an output terminal as the stabilization network, in the semiconductor device having the stabilization network of the present invention.

In the semiconductor device having the stabilization network, an example of the simulation result at the time of connecting the resistance R=10Ω and connecting 50Ω terminating resistance to the output terminal as the stabilization network, is shown in FIG. 14. According to the simulation result, it is S(2, 1)=−2.893×10$^{-15}$ dB at 70 GHz, and is S(2, 1)=−1.584 dB at 10 GHz.

In this case, in order to suppress the high frequency oscillation at 70 GHz, even if the positive resistance R=10Ω is connected for the drain of the FET, and it cancels the negative resistance value (about 10Ω) which appears in the drain, the gain of the FET drops and the output power drops at 10 GHz.

—RLC Parallel Circuit—

Figure 15:
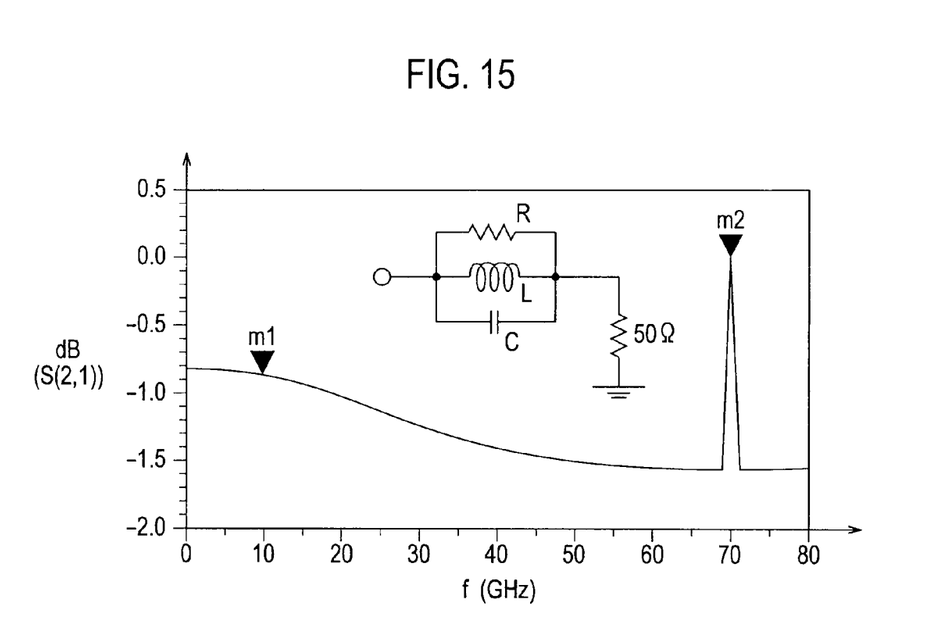
FIG. 15 shows an example of the simulation result at the time of connecting a parallel circuit of a resistance R, an inductance L, and a capacitance C, and connecting 50Ω terminating resistance to an output terminal as the stabilization network, in the semiconductor device having the stabilization network of the present invention.

In the semiconductor device having the stabilization network, an example of the simulation result at the time of connecting the parallel circuit of the resistance R, the inductance L, and the capacitance C, and connecting 50Ω terminating resistance to the output terminal as a stabilization network, is shown in FIG. 15. According to the simulation result, it is S(2, 1)=5.352×10$^{-7}$ dB at 70 GHz, and is S(2, 1)=−0.909 dB at 10 GHz. It is possible of a flow of the signal frequency at about 10 GHz by using LC parallel circuit of the inductance L and the capacitance C, and further holding the flexibility for selecting the thing having a smaller value as the inductance L, in order to obtain the positive value of resistance only at 70 GHz. In this case, the RLC parallel circuit composed of R=10Ω, L=0.0516 nH, and C=0.1 pF is applied as the stabilization network, for example.

Since an infinite reactance can be provided by LC parallel circuit which resonates with the oscillating frequency $F_{osc}$ of the Gunn oscillation, it becomes possible to give a positive value of resistance to the drain of the FET. By R=10Ω of positive resistance, the negative resistance in the oscillating frequency $F_{osc}$ of the Gunn oscillation can be removed, and the Gunn oscillation can be suppressed. The flexibility for obtaining the desired value of the inductance L increases by adding the capacitance C in parallel for RL parallel circuit. While the negative resistance accompanying the Gunn oscillation can be canceled and a positive value of resistance can be given by setting up an LC tank circuit synchronize with the Gunn oscillation frequency $F_{osc}$, the capacitance C becomes short for desired signal frequency.

—RL Parallel Circuit—

Figure 16:
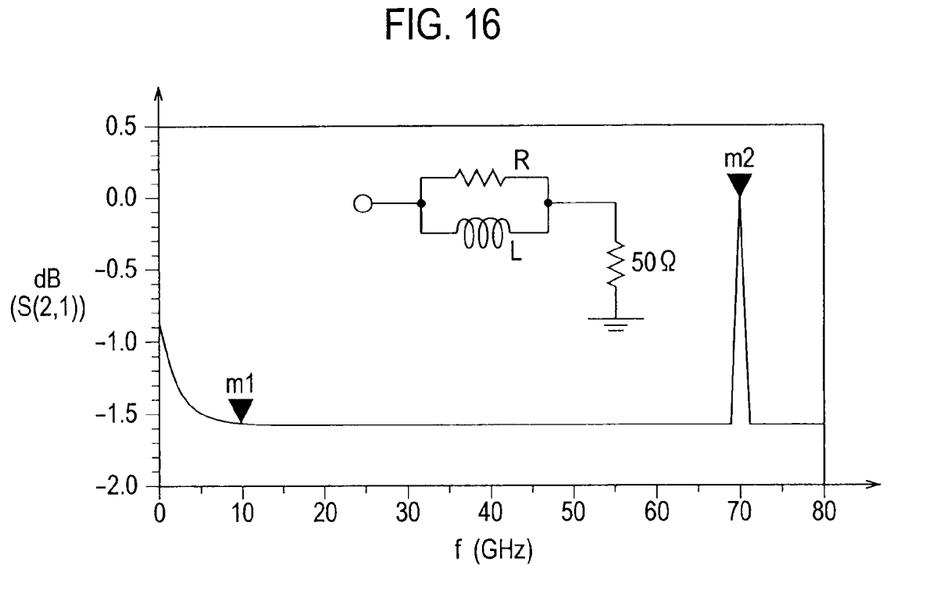
FIG. 16 shows an example of the simulation result at the time of connecting a parallel circuit of an inductance L and a resistance R, and connecting 50Ω terminating resistance to an output terminal as the stabilization network, in the semiconductor device having the stabilization network of the present invention.
Figure 17:
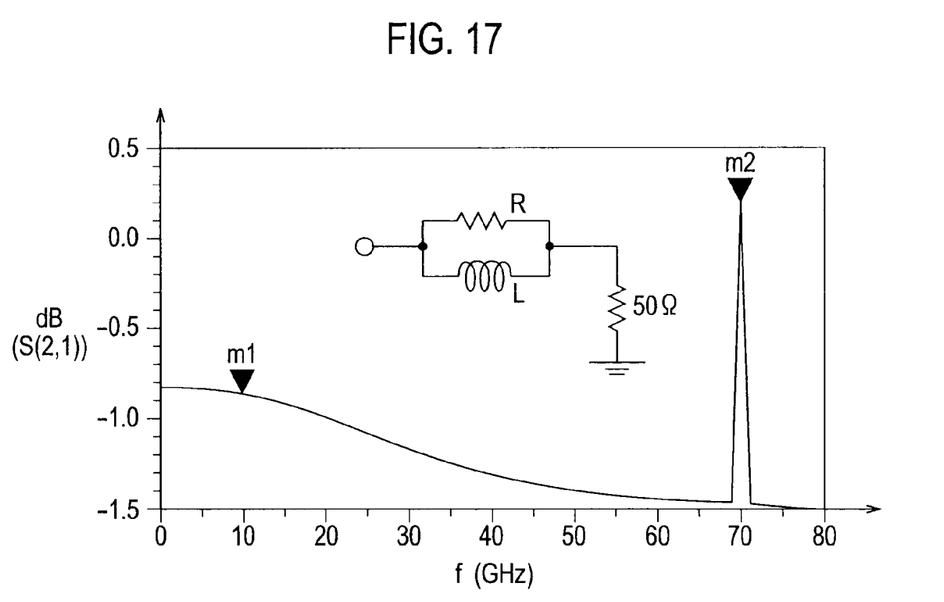
FIG. 17 shows an example of another simulation result at the time of connecting a parallel circuit of an inductance L and a resistance R, and connecting 50-ohm terminating resistance to an output terminal as the stabilization network, in the semiconductor device having the stabilization network of the present invention.

In the semiconductor device having the stabilization network, an example of the simulation result at the time of connecting the parallel circuit of the inductance L and the resistance R, and connecting 50Ω terminating resistance to the output terminal as a stabilization network, is shown in FIG. 16. According to the simulation result, it is S(2, 1)=4.264×10$^{-4}$ dB at 70 GHz, and is S(2, 1)=−1.566 dB at 10 GHz. In this case, it is R=10Ω and is L=1 nH.

In the semiconductor device having the stabilization network, an example of another simulation result at the time of connecting the parallel circuit of the inductance L and the resistance R, and connecting 50Ω terminating resistance to the output terminal as a stabilization network, is shown in FIG. 16. According to the simulation result, it is S(2, 1)=0.144 dB at 70 GHz, and is S(2, 1)=−0.901 dB at 10 GHz. In this case, it is R=10Ω and is L=0.05 nH. Although the inductance L of a great value works as open at 70 GHz and a positive value of resistance is given, since the impedance is generated, at 10 GHz, the gain of the transistor drops simultaneously. On the other hand, although it becomes possible to conduct for the signal frequency of 10 GHz enough for the inductance L of a small value, it is not a value effectual for giving a positive value of resistance in the inductance L of a small value, at 70 GHz.

The result of the above simulation proves that the stabilization network for suppressing the negative resistance accompanying the Gunn oscillation and obtaining stable and highly efficient power amplification by connecting the RLC parallel circuit as a stabilization network and the semiconductor device having the stabilization network can be provided.

Other Embodiments

While the present invention is described in accordance with the aforementioned first through fifth embodiments, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the semiconductor devices having the stabilization network according to the embodiments of the present invention are applicable not only to FETs and HEMTs but also other amplifying elements, such as LDMOS FETs (Lateral Doped Metal-Oxide-Semiconductor Field Effect Transistors), HBTs (Hetero-junction Bipolar Transistors), and MEMS (Micro Electro Mechanical Systems) devices.

Such being the case, the present invention covers a variety of embodiments, whether described or not.

INDUSTRIAL APPLICABILITY

A stabilization network and a semiconductor device having the stabilization network has a wide range of application fields, such as an internally matched power amplifier, a power MMIC (Monolithic Microwave Integrated Circuit), a microwave power amplifier, a millimeter-wave power amplifier, and a high frequency MEMS device.

REFERENCE SIGNS LIST

10: Substrate (semiconductor substrate, semi-insulating substrate SI);
12 and 32: Insulating layer;
14, 14a, and 14b; Metallic contacts layer;
16a and 16b; Metal layer;
18: Resistance film;
20: Source electrode;
22: Drain electrode;
24: Gate electrode;
26: Source region;
34: First metallic pattern;
36: Second metallic pattern;

40: Third metallic pattern;
110: RL parallel circuit;
120: RLC parallel circuit;
140 and 150: Active element (FET);
160: Output terminal;
S1, S2, . . . , S13: Source terminal electrode;
D: Drain terminal electrode;
G1, G2, . . . , G6: Gate terminal electrode;
SC1, SC2, . . . , SC13: VIA hole
R: Resistance;
L: Inductance; and
C: Capacitance.

The invention claimed is:

1. A stabilization network comprising:
a resistance connected between an output terminal and a drain terminal electrode of an active element which generates a negative resistance at an oscillation frequency of a high frequency negative resistance oscillation of Gunn oscillation and a value of the resistance is equal to an absolute value of the negative resistance; and
a tank circuit which is composed of an inductance and a capacitance which are connected in parallel with the resistance and synchronize with the oscillating frequency of the high frequency negative resistance oscillation,
wherein the capacitance is placed on an upper part or a lower part of the resistance, and the capacitance has an inter-digital capacitance structure composed of a first metal layer and a second metal layer placed adjacent to the first metal layer,
wherein the oscillation frequency is tuned with a resonance frequency of the tank circuit, so that the negative resistance of the active element is canceled by using the value of the resistance at the oscillation frequency, a source inductance is connected between a source of the active element being only a single active element and grounding electric potential.

2. The stabilization network according to claim 1, wherein the capacitance is placed adjacent to the inductance.

3. The stabilization network according to claim 1, wherein the capacitance is placed adjacent to the resistance.

4. The stabilization network according to claim 1, wherein the capacitance is laminated and placed in the upper part of the resistance.

5. The stabilization network according to claim 1, wherein the capacitance is laminated and placed in the lower part of the resistance.

6. The stabilization network according to claim 1, wherein the capacitance has an MIM capacitance structure composed of a first metal layer, an insulating layer placed on the first metal layer, and a second metal layer placed on the insulating layer.

7. The stabilization network according to claim 1, wherein the active element is one of a field effect transistor or a high electron mobility transistor.

8. A semiconductor device having a stabilization network wherein
the stabilization network comprises:
an active element which generates a negative resistance at an oscillation frequency of a high frequency negative resistance oscillation of Gunn oscillation; and
a tank circuit composed of a resistance connected between an output terminal and a drain terminal electrode of the active element, an inductance and a capacitance which are connected in parallel with the resistance and synchronize with the oscillating frequency of the high frequency negative resistance oscillation and a value of the resistance is equal to an absolute value of the negative resistance,
a source inductance is connected between a source of the active element being only a single active element and grounding electric potential,
wherein the capacitance is placed on an upper part or a lower part of the resistance, and the capacitance has an inter-digital capacitance structure composed of a first metal layer and a second metal layer placed adjacent to the first metal layer, and
wherein the oscillation frequency is tuned with a resonance frequency of the tank circuit, so that the stabilization network cancels the negative resistance by using the value of the resistance at the oscillation frequency.

9. The semiconductor device having the stabilization network according to claim 8, wherein
the capacitance is placed adjacent to the inductance.

10. The semiconductor device having the stabilization network according to claim 8, wherein
the capacitance is placed adjacent to the resistance.

11. The semiconductor device having the stabilization network according to claim 8, wherein
the capacitance is laminated and placed in the upper part of the resistance.

12. The semiconductor device having the stabilization network according to claim 8, wherein
the capacitance is laminated and placed in the lower part of the resistance.

13. The semiconductor device having the stabilization network according to claim 8, wherein
the capacitance has an MIM capacitance structure composed of a first metal layer, an insulating layer placed on the first metal layer, and a second metal layer placed on the insulating layer.

14. The semiconductor device having the stabilization network according to claim 8, further comprising:
a source inductance connected to the main electrode of another side of the active element.

15. The semiconductor device having the stabilization network according to claim 8, wherein
the active element is one of a field effect transistor or a high electron mobility transistor.

16. The semiconductor device having the stabilization network according to claim 8, wherein
the active element is a field effect transistor comprising:
a substrate;
a gate electrode, a source electrode, and a drain electrode which are placed on the substrate and have a plurality of fingers, respectively;
a gate terminal electrode, a source terminal electrode, and a drain terminal electrode which are placed on the substrate, govern a plurality of fingers, respectively and are formed for every the gate electrode, the source electrode, and the drain electrode; and
a VIA hole connected to the source terminal electrode.

* * * * *